US005552004A

United States Patent [19]

Lorraine et al.

[11] Patent Number: 5,552,004

[45] Date of Patent: Sep. 3, 1996

[54] METHOD OF MAKING AN ACOUSTIC COMPOSITE MATERIAL FOR AN ULTRASONIC PHASED ARRAY

[76] Inventors: Peter W. Lorraine, 876 Heather La., Niskayuna, N.Y. 12309; John T. Pedicone, 532 Pinard Dr., Orlando, Fla. 32825

[21] Appl. No.: 415,903

[22] Filed: Apr. 3, 1995

[51] Int. Cl.[6] .......................... H01L 41/08; G01N 29/00; H04R 17/00

[52] U.S. Cl. .................... 156/154; 128/662.03; 156/153; 156/250; 156/296; 310/334; 310/335

[58] Field of Search .................................... 156/153, 154, 156/296, 250; 128/660.01, 662.03; 310/334, 335, 336, 326, 327

[56] References Cited

U.S. PATENT DOCUMENTS 4,442,715 4/1984 Brisken et al. .

4,507,582 3/1985 Glenn .................................. 310/335 X 5,035,761 7/1991 Hempton ................................ 156/161

*Primary Examiner*—Jeff H. Aftergut

*Attorney, Agent, or Firm*—Cobrin Gittes & Samuel

[57] ABSTRACT

The present invention discloses an acoustic composite material for an ultrasonic phased array and a method for making. The acoustic composite material is formed from a microcapillary array having a plurality of holes of a constant cross-section and volume fraction. In each of the plurality of holes of the microcapillary array, a polymer fill is deposited therein. The polymer filled microcapillary array is cut at an axis perpendicular to the microcapillary array into a plurality of sections. Each of the plurality of sections are then ground into a predetermined thickness and bonded to a phased array of piezoelectric elements and backfill material.

11 Claims, 4 Drawing Sheets

METHOD OF MAKING AN ACOUSTIC COMPOSITE MATERIAL FOR AN ULTRASONIC PHASED ARRAY

BACKGROUND OF THE INVENTION

The present invention relates generally to an ultrasonic phased array transducer and more particularly to an acoustic composite material used with the ultrasonic phased array and a method for making.

A typical ultrasonic phased array transducer used in medical and industrial applications includes one or more piezoelectric elements placed between a pair of electrodes. The electrodes are connected to a voltage source. When a voltage is applied, the piezoelectric elements are excited at a frequency corresponding to the applied voltage. As a result, the piezoelectric elements emit an ultrasonic beam of energy into a media that it is coupled to at frequencies corresponding to the convolution of the transducer's electrical/acoustical transfer function and the excitation pulse. Conversely, when an echo of the ultrasonic beam strikes the piezoelectric elements, each element produces a corresponding voltage across its electrodes.

In addition, the ultrasonic phased array transducer typically includes an acoustic backing layer (i.e., a backfill) coupled to the piezoelectric elements. The backfill has a low impedance in order to direct the ultrasonic beam towards a patient or object. Typically, the backfill is made from a lossy material that provides high attenuation for diminishing reverberations. Also, the ultrasonic phased array includes acoustic matching layers coupled to the piezoelectric elements opposite from the backfill layer. The acoustic matching layers transform the acoustic impedance of the patient or object under inspection to a value closer to that of the piezoelectric elements. This improves the efficiency of sound transmission to the patient/object and increases the bandwidth over which sound energy is transmitted.

A problem associated with conventional matching layers is that they must be made from materials having impedances ranging from about 2 MRayls to about 12 MRayls. For optimal matching, the thickness and acoustic impedance of the matching layers are typically determined by using transducer design models. Frequently, the transducer design models require certain material parameters for which there are no materials available. If these materials are not available, then composite materials are typically used or a design compromise is made which sacrifices bandwidth and/or sensitivity. Examples of acoustic composite materials are particles suspended in a matrix (i.e., a 0–3 material) and engineered silicon materials with a "bed of nails" structure (i.e., a 1–3 connectivity). The particles suspended in a matrix approach provides a controlled impedance, but suffers from high attenuation and inhomogeneity resulting from the random distribution of particles in the matrix. The silicon "bed of nails" approach provides a controlled impedance and homogeneity, but requires an expensive and lengthy fabrication process. Thus, there is a need for an acoustic material that provides controlled impedance and low attenuation.

SUMMARY OF THE INVENTION

Therefore, it is a primary objective of the present invention to provide an acoustic material that provides superior performance for an ultrasonic phased array transducer.

A second object of the present invention is to use a microcapillary array filled with a polymer as an acoustic matching layer to provide controlled impedance and low attenuation for the ultrasonic phased array transducer.

Thus, in accordance with the present invention, there is provided a method for forming an acoustic composite material. The method comprises forming a microcapillary array having a plurality of holes of a constant cross-section and volume fraction. In each of the plurality of holes of the microcapillary array, a polymer material fill is deposited therein. Then the polymer filled microcapillary array is cut into a plurality of sections. The polymer filled microcapillary array is cut at an axis perpendicular to the microcapillary array. Each of the plurality of sections are then ground into a predetermined thickness.

In accordance with another embodiment of the present invention, there is provided an acoustic composite material comprising a microcapillary array having a plurality of holes of constant cross-section and volume fraction. Each of the plurality of holes of the microcapillary array have a polymer material deposited therein. The polymer filled microcapillary array is cut into a plurality of sections and is cut at an axis perpendicular to the microcapillary array. Each of the plurality of sections are ground into a predetermined thickness. The sections of ground microcapillary array are bonded to a piezoelectric ceramic material and a backfill material.

While the present invention will hereinafter be described in connection with an illustrative embodiment and method of use, it will be understood that it is not intended to limit the invention to this embodiment. Instead, it is intended to cover all alternatives, modifications and equivalents as may be included within the spirit and scope of the present invention as defined by the appended claims.

DETAILED DESCRIPTION OF THE PRESENT INVENTION

Figure 1:
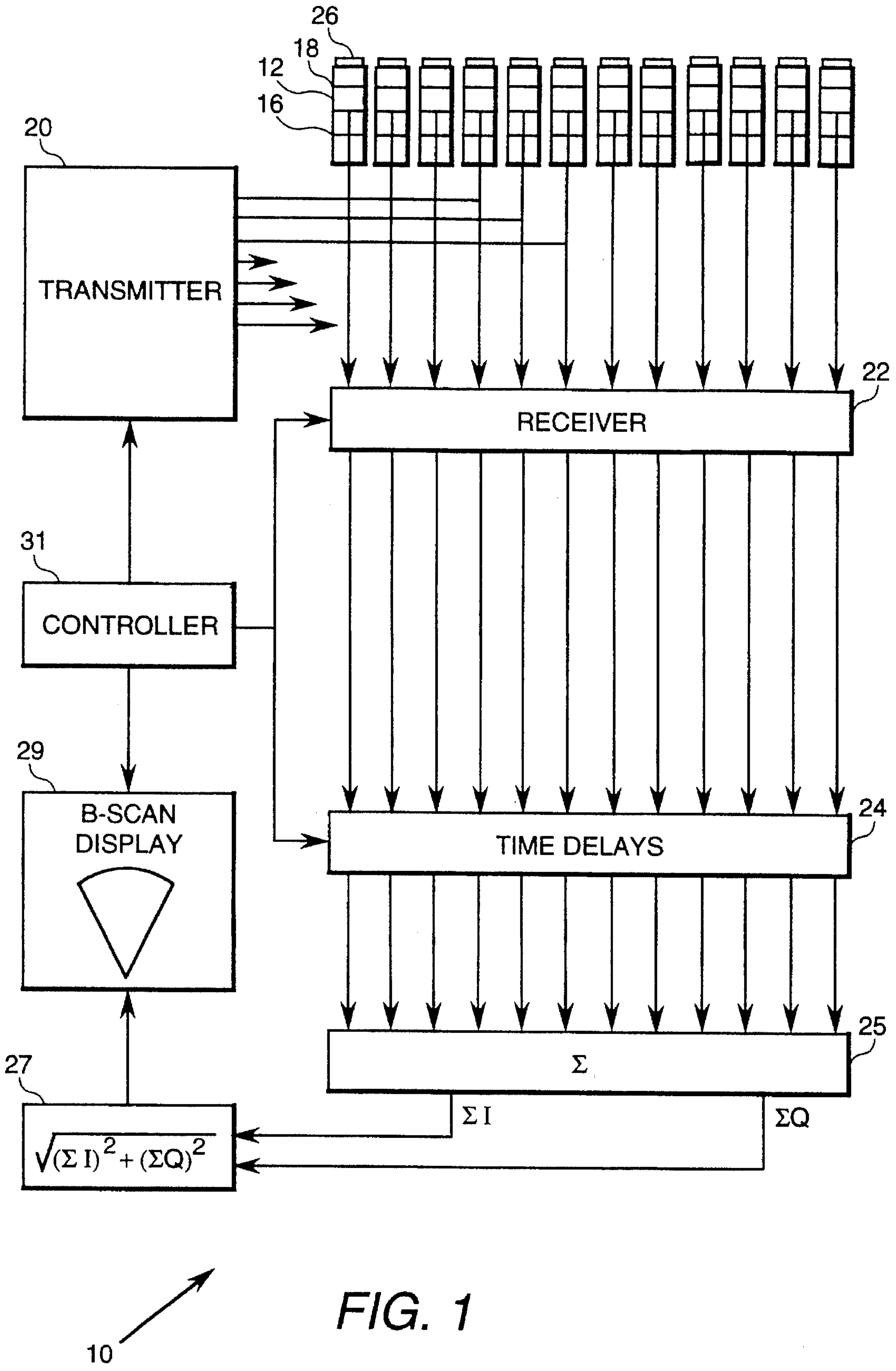
FIG. 1 is a schematic of an ultrasonic phased array transducer and associated transmitter/receiver electronics according to the present invention.

FIG. 1 is a schematic of an ultrasonic phased array imager 10 which is used in medical and industrial applications. The imager 10 includes a plurality of piezoelectric elements 12 defining a phased array 14. The piezoelectric elements are preferably made from a piezoelectric or relaxor material such as lead zirconium titanate (PZT) and are separated to prevent cross-talk and have an isolation in excess of 20 decibels. A backfill layer 16 is coupled at one end of the phased array 14. The backfill layer 16 is highly attenuating and has low impedance for preventing ultrasonic energy from being transmitted or reflected from behind the piezoelectric elements 12 of the phased array 14. Backfill layers having fixed acoustical properties are well known in the art and are used to damp the ultrasonic energy transmitted from the piezoelectric elements 12. The backfill layer in the present invention is preferably made from a combination of hard particles in a soft matrix such as dense metal or metal oxides powder in silicone rubber and distributed through an epoxy matrix. Acoustic matching layers 18 are coupled to an end of the phased array 14 opposite from the backfill layer 16. The matching layers 18 provide suitable matching impedance to the ultrasonic energy as it passes between the piezoelectric elements 12 of the phased array 14 and the patient/object. A more detailed description of the matching layers is provided later.

A transmitter 20 controlled by a controller 31 applies a voltage to the plurality of piezoelectric elements 12 of the phased array 14. A beam of ultrasonic beam energy is generated and propagated along an axis through the matching layers 18 and a lens 26. The matching layers 18 broaden the bandwidth (i.e., damping the beam quickly) of the beam and the lens 26 directs the beam to a patient/object. The backfill layer 16 prevents the ultrasonic energy from being transmitted or reflected from behind the piezoelectric elements 12 of the phased array 14. Echoes of the ultrasonic beam energy return from the patient/object, propagating through the lens 26 and the matching layers 18 to the PZT material of the piezoelectric elements 12. The echoes arrive at various time delays that are proportional to the distances from the ultrasonic phased array 14 to the patient/object causing the echoes. As the echoes of ultrasonic beam energy strike the piezoelectric elements, a voltage signal is generated and sent to a receiver 22 controlled by the controller 31. The voltage signals at the receiver 22 are delayed by an appropriate time delay at a time delay means 24 set by the controller 31. The delay signals are then summed at a summer 25 and a circuit 27. By appropriately selecting the delay times for all of the individual piezoelectric elements and summing the result, a coherent beam sum is formed. The coherent beam sum is then displayed on a B-scan display 29 that is controlled by the controller 31. A more detailed description of the electronics connected to the phased array 14 is provided in U.S. Pat. No. 4,442,715, which is incorporated herein by reference.

Figure 2:
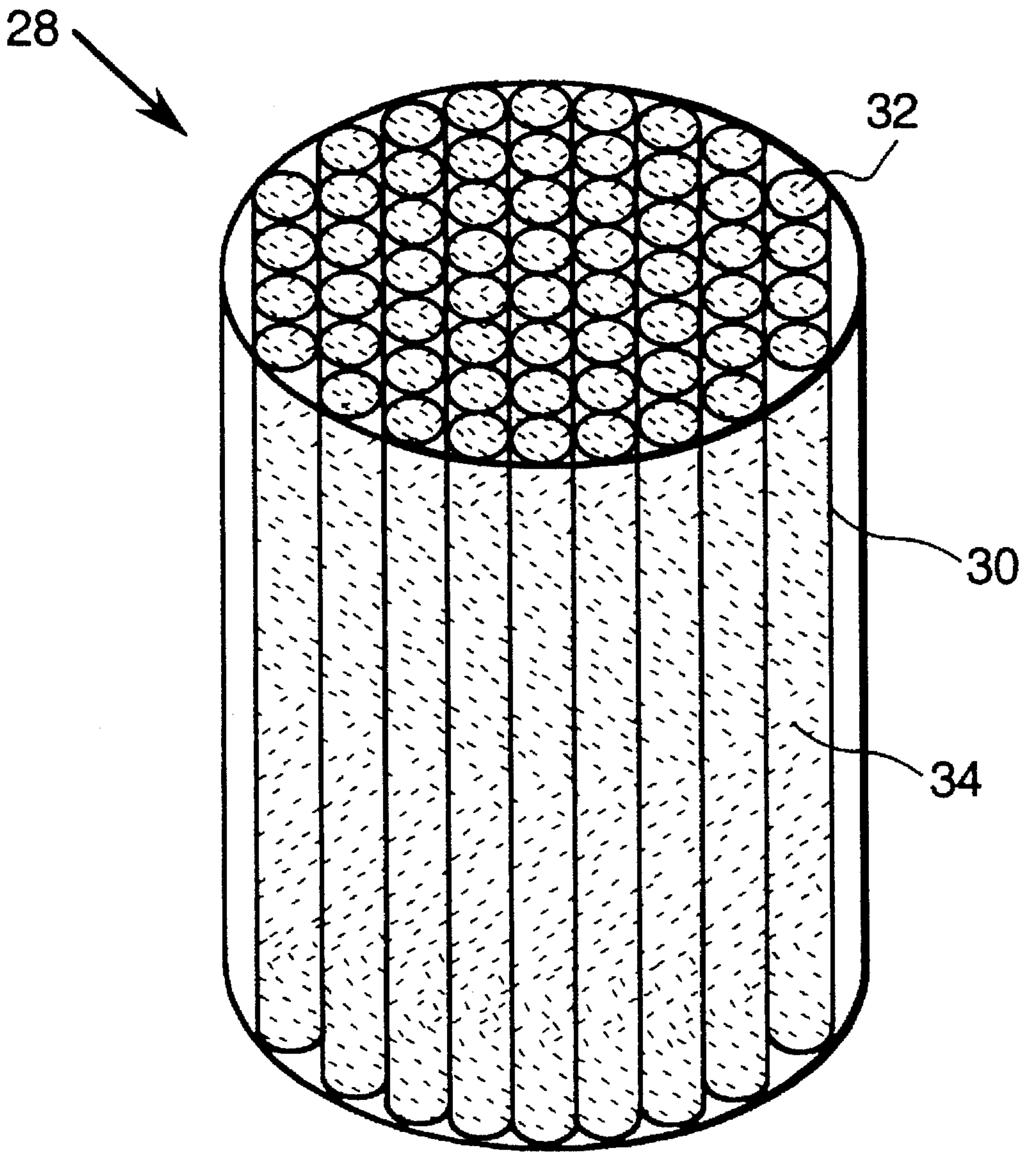
FIG. 2 is a schematic of an acoustic composite material used in the ultrasonic phased array transducer according to the present invention.

FIG. 2 is a schematic of an acoustic composite material 28 that is used as an acoustic matching layer 18 for the ultrasonic phased array transducer 14. The acoustic composite material 28 includes a microcapillary array 30 having a plurality of holes 32 of constant cross-section and volume fraction. Each of the plurality of holes 32 of the microcapillary array 30 have a polymer fill 34 deposited therein. The polymer filled microcapillary array 30 is cut into a plurality of sections at an axis perpendicular to the array. Each of the plurality of sections are ground or machined into a predetermined thickness and bonded to the piezoelectric elements 12 and backfill material 16.

The acoustic composite material 28 enables the ultrasonic phased array transducer to realize superior performance. In particular, the acoustic composite material 28 has acoustic properties that are intermediate to the piezoelectric elements 12 and the patient/object. Also, the acoustic properties can be varied by adjusting the hole size and the fill material. The acoustic properties of the acoustic composite material depend on the microcapillary array and the fill, and are predicated by the following equations:

$$Z_{comp}=(1-x)Z_{array}+xZ_{fill}, \quad (1)$$

$$c_{comp}=\sqrt{\frac{(1-x)k_{array}+xk_{fill}}{(1-x)\rho_{array}+x\rho_{fill}}}, \quad (2)$$

wherein $Z_{comp}$, $Z_{array}$, and $Z_{fill}$ are the impedances for the composite, the microcapillary array, and the fill, respectively; $c_{comp}$ is the longitudinal sound velocity of the composite; $k_{array}$ and $k_{fill}$ are the microcapillary array and fill bulk modulus, respectively; $\rho_{array}$ and $\rho_{fill}$ are the density of the microcapillary array and the fill, respectively; and x is the hole volume fraction of the microcapillary array. Low attenuation for longitudinal sound along the direction of the array follows if the intrinsic attenuations for both the array and the fill are low and the periodicity of the holes is fine. The choice of a microcapillary array as the surrounding matrix insures homogeneity throughout the material and the polymer insures that the impedance is the range of about 5–10 MRayls.

Figure 3A:
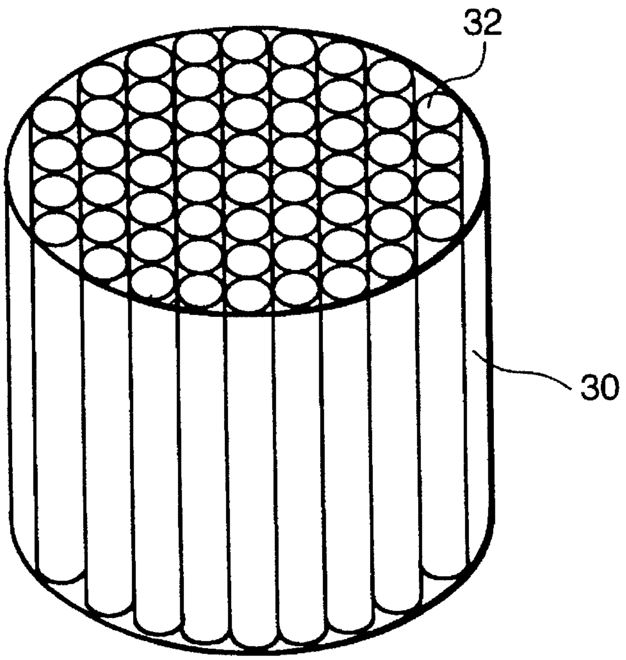
FIGS. 3A–3D illustrate a schematic method of forming the acoustic composite material according to the present invention.

FIGS. 3A–3D illustrate a schematic method of fabricating the acoustic composite material 28 according to the present invention. The specific processing conditions and dimensions serve to illustrate the present method but can be varied depending upon the materials used and the desired application and geometry of the phased array transducer. First, as shown in FIG. 3A, a microcapillary array 30 having a plurality of holes 32 of a constant cross-section and volume fraction is formed. In the illustrative embodiment, the microcapillary array is a glass microcapillary array. having a parallel number of holes that are less than about 10 μm and have a glass volume fraction of about 50%. Typically, a glass microcapillary array having these dimensions are commercially available and can be purchased off the shelf. An alternative to the glass microcapillary array would be a polymer microcapillary array having similar dimensions.

Figure 3B:
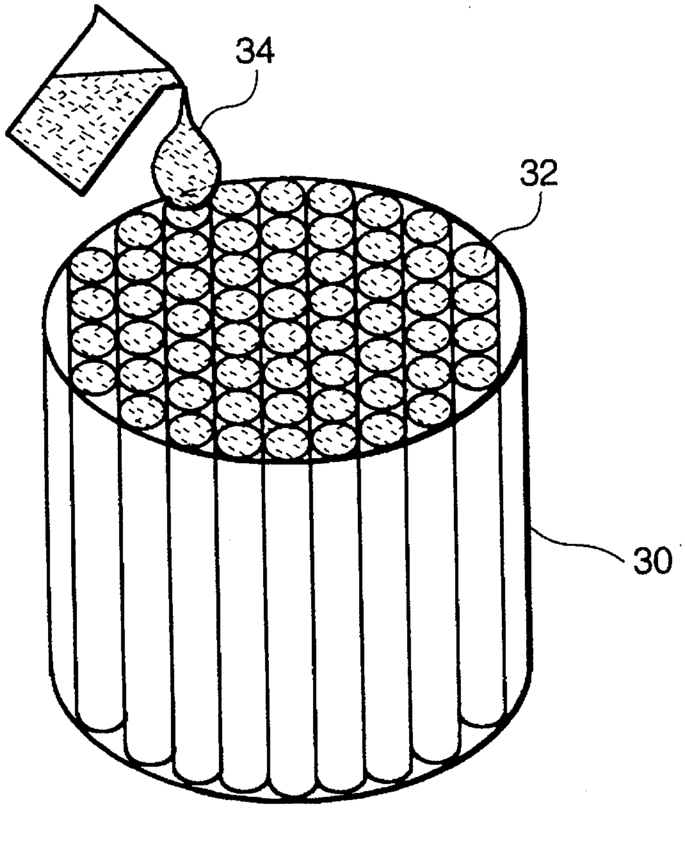

Then, in FIG. 3B, a low viscosity polymer fill 34 is deposited in each of the plurality of holes 32 of the microcapillary array 30 with a mild pressure differential. In the illustrative embodiment, the polymer fill is an epoxy such as Spurr's epoxy. The resultant structure has an impedance of approximately 8.7 MRayls with negligible attenuation that is less than 0.3 dB/MHz/cm. The acoustical properties can be changed by varying the volume fraction or composition of the polymer. The polymer fill can be deposited in the array of holes by flowing or injection. If the polymer microcapillary array were used, the array of holes could be filled with a conducting material deposited by using techniques such as flowing, electrodeless chemical deposition, chemical vapor deposition, or electroplating.

Figure 3D:
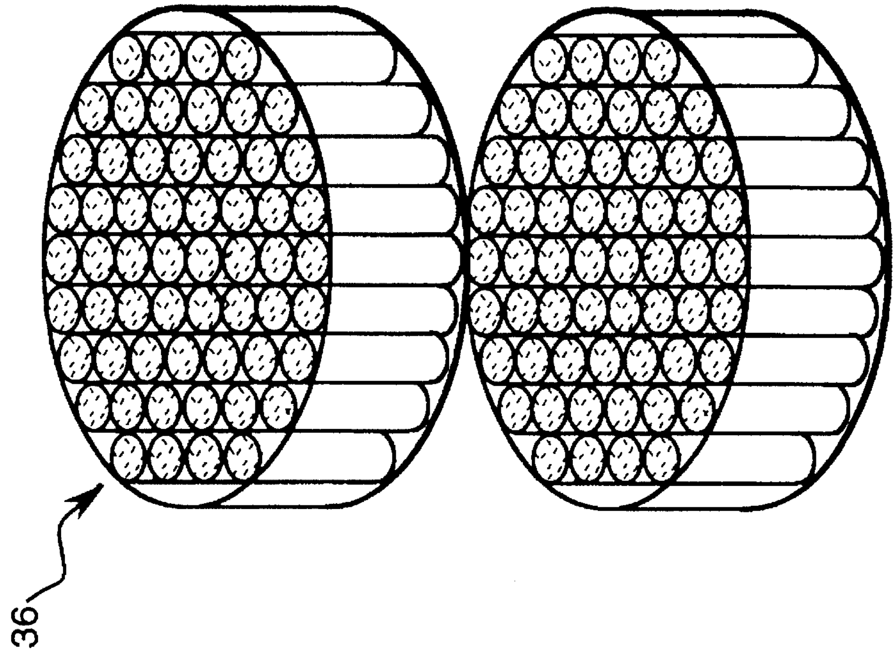
Figure 3C:
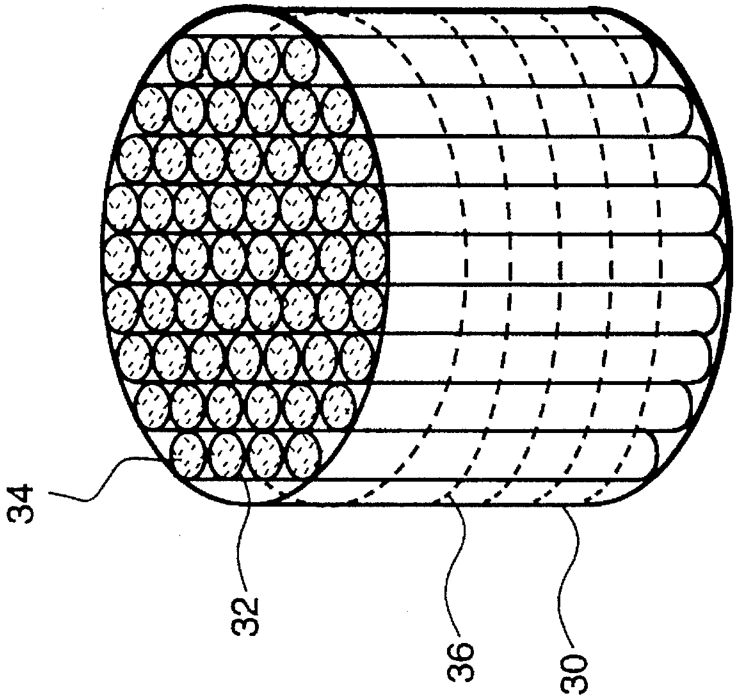

After the polymer fill has been deposited, the microcapillary array is cut at an axis perpendicular to the array into a plurality of sections 36 (FIG. 3C). In the illustrative embodiment, the polymer filled microcapillary array 30 is cut into a plurality of sections by a laser or a dicing saw. After the polymer filled microcapillary array has been sectioned, each of the sections are ground or machined to a predetermined thickness as shown in FIG. 3D. After grinding, the sections of the polymer filled microcapillary array are used as acoustic matching layers and bonded to the phased array 14 of piezoelectric elements and backfill material. The sections of polymer filled microcapillary array have a fine periodicity (i.e., 10 μm) that provides controlled impedance, low attenuation and consistent acoustic properties. If desired, the acoustic properties can be varied by adjusting the hole size of the microcapillary array and the fill material. In addition, the acoustic composite materials of the present invention are significantly cheaper to manufacture than the aforementioned conventional acoustic materials.

It is therefore apparent that there has been provided in accordance with the present invention, an acoustic composite material and a method for making that fully satisfy the aims and advantages and objectives hereinbefore set forth. The invention has been described with reference to several embodiments, however, it will be appreciated that variations and modifications can be effected by a person of ordinary skill in the art without departing from the scope of the invention.

We claim:

1. A method for forming an acoustic composite material, comprising the steps of:

forming a microcapillary array having a plurality of holes of a constant cross-section and volume fraction;

depositing a polymer fill in each of the plurality of holes of the microcapillary array;

cutting the polymer filled microcapillary array into a plurality of sections; the polymer filled microcapillary array cut at an axis perpendicular to the microcapillary array; and grinding each of the plurality of sections into a predetermined thickness.

2. A method according to claim 1, wherein the microcapillary array is a glass microcapillary array.

3. A method according to claim 2, wherein the glass microcapillary array has a number of parallel holes of about 10 μm and glass volume fraction of about 50%.

4. A method according to claim 3, wherein the polymer fill is an epoxy.

5. A method according to claim 4, wherein the epoxy is deposited in the array of holes by one of flowing or injection.

6. A method according to claim 1, wherein the microcapillary array is a polymer microcapillary array.

7. A method according to claim 1, wherein the step of cutting is made with one of a laser or a dicing saw.

8. A method for forming an acoustic composite material for an ultrasonic phased array having an array of piezoelectric elements and a backfill layer coupled to the piezoelectric elements at one end, the method comprising the steps of:

forming a microcapillary array having a plurality of holes of a constant cross-section and volume fraction, wherein the microcapillary array is a glass microcapillary array;

depositing a polymer fill in each of the plurality of holes of the microcapillary array;

cutting the polymer filled microcapillary array into a plurality of sections; the polymer filled microcapillary array cut at an axis perpendicular to the microcapillary array;

grinding each of the plurality of sections into a predetermined thickness; and bonding the plurality of ground sections to the array of piezoelectric elements to an end opposite the backfill layer.

9. A method according to claim 8, wherein the glass microcapillary array has a number of parallel holes of about 10 μm and glass volume fraction of about 50%.

10. A method according to claim 8, wherein the polymer is an epoxy.

11. A method according to claim 10, wherein the epoxy is deposited in the array of holes by one of flowing or injection.

* * * * *

UNITED STATES PATENT AND TRADEMARK OFFICE

CERTIFICATE OF CORRECTION

PATENT NO. : 5,552,004

DATED : September 3, 1996

INVENTOR(S) : Lorraine, et. al.

It is certified that error appears in the above-indentified patent and that said Letters Patent is hereby corrected as shown below:

Title page, item [73], Assignee: insert-- GENERAL ELECTRIC COMPANY SCHENECTADY, NEW YORK, and Title page, after "Attorney, Agent, or Firm-" delete-- Cobrin Gittes & Samuel" and insert--David C. Goldman; Marvin Snyder--therefor.

Signed and Sealed this

Nineteenth Day of November, 1996

*Attest:*

BRUCE LEHMAN

*Attesting Officer* *Commissioner of Patents and Trademarks*